United States Patent [19]

Murakami et al.

[11] Patent Number: 5,747,878

[45] Date of Patent: May 5, 1998

[54] OHMIC ELECTRODE, ITS FABRICATION METHOD AND SEMICONDUCTOR DEVICE

[75] Inventors: Masanori Murakami; Takeo Oku, both of Kyoto; Akira Otsuki, Shiga, all of Japan

[73] Assignee: Sony Corporation, Tokyo, Japan

[21] Appl. No.: 822,060

[22] Filed: Mar. 24, 1997

Related U.S. Application Data

[63] Continuation of Ser. No. 282,488, Aug. 1, 1994, abandoned.

[30] Foreign Application Priority Data

Aug. 11, 1993 [JP] Japan ................................. 5-237122

[51] Int. Cl.$^6$ ........................... H01L 23/48; H01L 23/52
[52] U.S. Cl. ...................... 257/745; 257/743; 257/750; 257/763; 257/766; 257/768
[58] Field of Search ........................ 257/743, 745, 257/750, 763, 766, 768; 437/57, 192

[56] References Cited

U.S. PATENT DOCUMENTS

| | | |
|---|---|---|
| 4,228,455 | 10/1980 | Yasuda et al. . |
| 5,045,408 | 9/1991 | Williams et al. . |
| 5,309,022 | 5/1994 | Gill et al. . |
| 5,317,190 | 5/1994 | Fleischman et al. . |
| 5,358,899 | 10/1994 | Fleischman et al. . |
| 5,430,310 | 7/1995 | Shibasaki et al. ................. 257/190 |

FOREIGN PATENT DOCUMENTS 0 077 893 A2  5/1983  European Pat. Off. .
0 323 554     9/1989  European Pat. Off. .

OTHER PUBLICATIONS

Journal of Vacuum Science & Technology B. vol. 4, No. 3, May 1986–Jun. 1986 Woodbury, NY, US. pp. 762–768, Taeil Kim et al. "The Effects of Germanium Concentration on the Compound Formation and Morphology of Gold–Based Contacts. Etc".

Thin Solid Films, vol. 147; No. 2, Mar. 2, 1987, Lausanne, Switzerland, pp. 177–192, Taeil Kim et al. In Situ X–ray Diffraction Study of the Effects of Germanium and Nickel Concentration on Melting in Gold–Based Contacts to Gallium Etc.

Jornal of Applied Physics, Vo. 75, No. 5, Mar. 1, 1994, New York pp. 2530–2537, H.R. Kawata et al. "NiGe–base ohmic contacts to n–type GaAs II. Effects of Au Addition".

*Primary Examiner*—Valencia Martin Wallace
*Attorney, Agent, or Firm*—Hill & Simpson

[57] ABSTRACT

An ohmic electrode for III-V compound semiconductors such as GaAs semiconductors is provided to have satisfactory practical characteristics. Provided on an $n^+$-type GaAs substrate is an ohmic electrode in which an $n^{++}$-type regrown GaAs layer regrown from the $n^+$-type GaAs substrate and a NiGe film containing particles of a precipitate composed of $\alpha'$-AuGa are sequentially stacked. The ohmic electrode may be fabricated by sequentially stacking a Ni film, Au film and Ge film on the $n^+$-type GaAs substrate, then patterning these films by, for example, lift-off, and thereafter annealing the structure at a temperature of 400–750° C. for several seconds to several minutes.

19 Claims, 8 Drawing Sheets

OHMIC ELECTRODE, ITS FABRICATION METHOD AND SEMICONDUCTOR DEVICE

This is a continuation, of application Ser. No. 08/282,488, filed Aug. 1, 1994, now abandoned.

BACKGROUND OF THE INVENTION

1. Field of the Invention

This invention relates to an ohmic electrode, its fabricating method and a semiconductor device, and more particularly to an ohmic electrode for a III-V compound semiconductor, its fabricating method, and a semiconductor device using the ohmic electrode.

2. Description of the Related Arts

From the viewpoint of improving the performance and reliability of a device such as an FET using a compound semiconductor, reducing the contact resistance of its ohmic electrode and improving its thermal stability are of great importance. However, with respect to compound semiconductors, particularly, III-V compound semiconductors such as GaAs semiconductors, there have been none that satisfy the above-indicated requirements.

Ohmic electrodes for GaAs semiconductors which have been put in practical use or proposed can generally be classified into the following three types. In ohmic electrodes of the first type, an ohmic metal employed includes an element behaving as a donor impurity for GaAs semiconductors. By annealing, the element is diffused in the semiconductor and makes an n-type region having a high impurity concentration along the interface between the electrode metal and the semiconductor such that an ohmic contact is established due to a tunneling effect or the like. In ohmic electrodes of the second type, an ohmic electrode employed includes an element forming an intermediate layer of a low energy barrier. By annealing, the element makes an intermediate layer of a lower energy barrier between the electrode metal and the semiconductor such that an ohmic contact is established by lowering the energy barrier in the region where carriers move. In ohmic electrodes of the third type, an ohmic electrode employed includes an element reacting with GaAs semiconductors when annealed and making a regrown semiconductor layer, and an element behaving as a donor impurity for GaAs semiconductors. By annealing, such a regrown layer is formed and changed into an n-type having a high impurity concentration such that an ohmic contact is established due to a tunnelling effect or the like.

A typical example of ohmic electrodes of the first type is shown in FIGS. 1A and 1B. In this example, a AuGe/Ni film 2 as an ohmic metal is formed on an $n^+$-type GaAs substrate 1 as shown in FIG. 1A. Then, it is annealed at 400–500° C. to make the ohmic electrode as shown in FIG. 1B. In FIG. 1B, reference numeral 3 denotes an $n^{++}$-type GaAs layer, and 4 denotes a layer including NiAs and β-AuGa.

The ohmic electrode shown in FIG. 1B, however, has a bad thermal stability. That is, in this case, a large amount of Au contained in the AuGe/Ni film 2 as the ohmic metal (typically employed AuGe contains 88% of Au) reacts with the n+-type GaAs substrate 1 when annealed at the temperature of 400°0 C. or higher and forms P-AuGa (hexagonal close packed (HCP) structure, melting point $T_m$ =375° C.) in the layer 4. Therefore, although the contact resistance of the ohmic electrode certainly decreases, the thermal stability is deteriorated. As a result, the device characteristics are deteriorated when a high temperature is applied in a process such as chemical vapor deposition (CVD) executed after the formation of the ohmic electrode. In addition, β-AuGa produced by reaction of the $n^+$-type GaAs substrate 1 with Au in the AuGe/Ni film 2 causes a rough surface of the ohmic electrode and makes subsequent fine patterning difficult.

The ohmic electrode shown in FIG. 1B involves another problem that it cannot cope with thinning of the $n^{++}$-type GaAs layer 3 and reduction of size of devices such as an FET. That is, since the $n^{++}$-type GaAs layer 3 is formed by diffusion during annealing, an extension thereof in the depth direction and in the lateral direction (parallel to the substrate) is determined solely by the temperature and the time of the annealing. Therefore, an extension of the $n^{++}$-type GaAs layer 3 in the depth and lateral directions cannot be controlled. As a result, it is difficult to reduce the thickness of the $n^{++}$-type GaAs layer 3 and to reduce distances between ohmic electrodes for improving the performance and reducing the size of device.

Ohmic electrodes of the second and third types have been proposed to overcome the problems caused by the use of the AuGe/Ni film 2 for fabricating an ohmic electrode in the typical example of the first type, i.e., the thermal instability of the ohmic electrode and a rough surface of the electrode.

A typical example of ohmic electrodes of the second type is shown in FIGS. 2A and 2B. In this example, sequentially provided on an $n^+$-type GaAs substrate 11 are a NiIn film 12 and a W film 13 as ohmic metals as shown in FIG. 2A. Thereafter, the structure is annealed for a second or so at a high temperature of about 900° C. to form the ohmic electrode as shown in FIG. 2B. In FIG. 2B, reference numeral 14 denotes an InGaAs (abbreviated representation used hereinafter for $In_xGa_{1-x}As$) layer, and 15 denotes a $Ni_3In$ film. In this case, the InGaAs layer 14 as an intermediate layer of a low energy barrier is formed by reaction of the $n^+$-type GaAs substrate 11 and In in the NiIn film 12 by annealing, and an ohmic contact is established by a decrease in effective height of the energy barrier. Since the ohmic electrode shown in FIG. 2B does not include a compound such as a β-AuGa having a low melting point as included in the ohmic electrode of the first type shown in FIG. 1B, it has been reported that the contact resistance of the ohmic electrode is stable even against annealing at about 400° C. for about 100 hours.

However, since the ohmic electrode shown in FIG. 2B requires an annealing at a high temperature of about 900° C. for establishing an ohmic contact, it cannot be used in devices such as a JFET (junction gate FET) and a HEMT (high electron mobility transistor) in which a gate and a channel are formed at a temperature below 900°0 C. Therefore, the ohmic electrode involves the problems that the process window is small and that its use is limited to only a few kinds of devices.

A typical example of ohmic electrodes of the third type is shown in FIG. 3. In this example, Pd film 22 and a Ge film 23 as ohmic metals are sequentially stacked on a $n^+$-type GaAs substrate 21, as shown in FIG. 3A. The structure is then annealed at about 325–375° C. for about 30 minutes to form the ohmic electrode as shown in FIG. 3B. In FIG. 3B, reference numeral 24 denotes an $n^{++}$-type GaAs layer, and 25 denotes a PdGe film. In this case, while annealed, a regrown layer of GaAs is first formed from the $n^+$-type GaAs substrate 21, and Ge in the Ge film 23 is then diffused into the regrown layer. As a result, the $n^{++}$-type GaAs layer 24 is formed to establish an ohmic contact.

With the ohmic electrode shown in FIG. 3B, thickness of the regrown $n^{++}$-type GaAs layer 24 can controlled by changing the thicknesses of the Pd film 22 and the Ge film 23 as ohmic metals. Therefore, ohmic electrode of this type permits a decrease in thickness of the n$^{++}$-type GaAs layer 24 and in distances between ohmic electrodes. The ohmic electrode shown in FIG. 3B, however, involves a serious problem with respect to the thermal stability.

The above-discussed characteristics of the ohmic electrodes of the first, second and third types summarized in Table 1.

TABLE 1

| type | difficulty of process | contact resistance | thermal stability | surface flatness | short diffusion length |
|---|---|---|---|---|---|
| 1 | good | good | bad | bad | bad |
| 2 | bad | good | good | good | good |
| 3 | good | good | bad | good | good |
| present invention | good | good | good | good | good |

As mentioned above, since existing ohmic electrodes for GaAs semiconductors are unsatisfactory, realization of an ohmic electrode having practically satisfactory characteristics has been desired.

OBJECTS AND SUMMARY OF THE INVENTION

It is therefore a first object of the invention to provide an ohmic electrode for a GaAs semiconductor and other III-V compound semiconductors having satisfactory practical characteristics.

A second object of the invention is to provide a method for fabricating an ohmic electrode for readily fabricating an ohmic electrode for a GaAs semiconductor and other III-V compound semiconductors which has practically satisfactory characteristics in practice.

A third object of the invention is to provide a semiconductor device including a semiconductor elemental device provided on a GaAs semiconductor or other III-V compound semiconductor body and having an ohmic electrode with satisfactory characteristics in practice.

According to an aspect of the invention, there is provided an ohmic electrode, comprising:

a regrown III-V compound semiconductor layer regrown from a III-V compound semiconductor body; and a NiGe film arranged on the regrown III-V compound semiconductor layer and including particles of a precipitate which has a melting point of 400° C. or higher and which is a compound of at least one element selected from a group consisting of Au, Pt, Pd and Ag and a group III element constituting the III-V compound semiconductor body.

The III-V compound semiconductor body may be a substrate or a layer composed of, for example, GaAs, AlGaAs or InGaAs. If the III-V compound semiconductor body is of an n-type, it includes, for example, Si, Ge, Te or Sn as a donor impurity. The donor impurity is introduced into the III-V compound semiconductor body by, for example, ion implantation, liquid phase epitaxy (LPE), molecular beam epitaxy (MBE) or metal organic vapor phase epitaxy (MOVPE).

The regrown III-V compound semiconductor layer may be a layer composed of, for example, GaAs, AlGaAs or InGaAs. If the III-V compound semiconductor body is of an n-type, the regrown III-V compound semiconductor layer is also of the n-type. In a preferred working form of the ohmic electrode according to the invention, the regrown III-V compound semiconductor layer has a higher impurity concentration than the III-V compound semiconductor body. The higher impurity concentration of the regrown III-V compound semiconductor layer compared to the III-V compound semiconductor body means that the regrown III-V compound semiconductor layer has a lower resistivity than the III-V compound semiconductor body. In a preferred working form of the ohmic electrode according to the invention, the regrown III-V compound semiconductor layer matches in crystal lattice with the III-V compound semiconductor body.

The the precipitate contained in the NiGe film typically are on the form of fine particles which are distributed in the NiGe film. From the viewpoint of obtaining good ohmic characteristics, the probability of the presence of the precipitate is preferably small near the interface between the NiGe film and the regrown III-V compound semiconductor layer. Specifically, the probability of the presence along the interface is preferably 50% or less. Also when the particles of the precipitate are occasionally distributed also in the regrown III-V compound semiconductor layer, the probability of the presence near the interface between the regrown III-V compound semiconductor layer and the III-V compound semiconductor body is preferably 50% or less. The NiGe film may include a certain amount of substances (such as NiGaAs, for example) other than the particles of the precipitate referred to above.

In a preferred working form of the ohmic electrode according to the invention, the III-V compound semiconductor body is an n-type GaAs substrate, the regrown III-V compound semiconductor layer is an n-type GaAs layer, the element selected from the group consisting of Au, Pt, Pd and Ag is Au, and the compound is α'-AuGa.

According to another aspect of the invention, there is provided a method for fabricating an ohmic electrode including: a regrown III-V compound semiconductor layer regrown from a III-V compound semiconductor body; and a NiGe film arranged on the regrown III-V compound semiconductor layer and including particles of a precipitate which has a melting point of 400° C. or higher and is compound of at least one element selected from a group consisting of Au, Pt, Pd and Ag and a group III element constituting the III-V compound semiconductor body comprising the steps of:

sequentially providing on the III-V compound semiconductor body a Ni film, a metal film composed of at least one element selected from a group consisting of Au, Pt, Pd and Ag, and a Ge film; and annealing the III-V compound semiconductor body having thereon the Ni film, the metal film and the Ge film.

The III-V compound semiconductor body may be a substrate or a layer composed of, for example, GaAs, AlGaAs or InGaAs. If the III-V compound semiconductor body is of an n-type, it contains, for example, Si, Ge, Te or Sn as a donor impurity. The regrown III-V compound semiconductor layer is a substrate or a layer composed of, for example, GaAs, AlGaAs or InGaAs. In a preferred working form of the method for fabricating an ohmic electrode according to the invention, the regrown III-V compound semiconductor layer has a higher impurity concentration than the III-V compound semiconductor body.

The metal film may be a single layer composed of only one of an Au film, Pt film, Pd film and Ag film or a multi-layer composed of two or more of the above films. The metal film may also be made of an alloy composed of two or more elements of Au, Pt, Pd and Ag.

In a preferred working form of the method for fabricating an ohmic electrode according to the invention, the III-V compound semiconductor body is an n-type GaAs substrate, the regrown III-V compound semiconductor layer is an n-type GaAs layer, the element selected from the group consisting of Au, Pt, Pd and Ag is Au, the compound is α'-AuGa, and the metal film is an Au film. The α'-AuGa has a face centered cubic (FCC) structure whose melting point $T_m$ is 415° C., which is 40° C. higher than β-AuGa.

When the metal film is an Au film, that is, when a Ni film, Au film and Ge film are used as materials for making the ohmic electrode, the atomic ratio $X_{Ni}/X_{Ge}$ of the Ni film relative to the Ge film ($X_{Ni}$: number of atoms in the Ni film, $X_{Ge}$: number of atoms in the Ge film) is preferably ~1 or less from the standpoint of obtaining a low contact resistance, and preferably ~0.8 from the standpoint of obtaining a good thermal stability as well.

In the method for fabricating an ohmic electrode according to the invention, the annealing temperature is preferably selected in the range of 400~750° C. from the viewpoint of obtaining a low contact resistance. The annealing may be conducted in two divisional steps. More specifically, the first annealing is preferably conducted at a temperature of, for example, 200~400° C. lower than the temperature of the second annealing, and thereafter, the second annealing is preferably conducted at a temperature of 400~750° C.

According to still another aspect of the invention, there is provided a semiconductor device including a semiconductor elemental device on a III-V compound semiconductor body, and the semiconductor elemental device has an electrode comprising:

a regrown III-V compound semiconductor layer regrown from the III-V compound semiconductor body; and a NiGe film formed on the regrown III-V compound semiconductor layer and including particles of a precipitate which has a melting point of 400° C. or higher and is a compound of at least one element selected from a group consisting of Au, Pt, Pd and Ag and a group III element constituting the III-V compound semiconductor body.

The semiconductor elemental device may be a FET such as MESFET, JFET, HEMT and so on, a HBT (heterojunction bipolar transistor), a semiconductor laser, a light emitting diode, or the like.

In a preferred working form of the semiconductor device according to the invention, the regrown III-V compound semiconductor layer has a higher impurity concentration than the III-V compound semiconductor body. In a preferred working form of the semiconductor device according to the invention, the element selected from the group consisting of Au, Pt, Pd and Ag is Au, and the compound is α'-AuGa.

According to the ohmic electrode of the invention, by employing the structure in which the NiGe film having a melting point as high as $T_m=850°$ C. contains particles of precipitate such as α'-AuGa which has a melting point of 400° C. or higher and is a compound of at least one element selected from a group consisting of Au, Pt, Pd and Ag and a group III element composing the III-V compound semiconductor body a good thermal stability is obtained as compared with an ohmic electrode containing a compound such as β-AuGa having a low melting point. In addition, due to a composite effect obtained by forming the NiGe film on the regrown III-V compound semiconductor layer regrown from the III-V compound semiconductor body, various characteristics other than the thermal stability, namely, low contact resistance, low film resistance, surface flatness, short diffusion length, etc. are also satisfactorily improved. That is, an ohmic electrode can be obtained, which satisfies characteristics required for practical use of devices and facilitates the process taken for fabricating the ohmic electrode.

According to the method for fabricating an ohmic electrode of the invention comprising the above-described steps, an ohmic electrode satisfying various characteristics required for practical use of devices can be readily fabricated.

According to the semiconductor device of the invention having the above-described arrangement, since the ohmic electrode of the semiconductor elemental device satisfies various characteristics required for practical use of such devices, a semiconductor device having a high performance can be realized.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention will be described below with reference to the drawings.

Figure 1A:
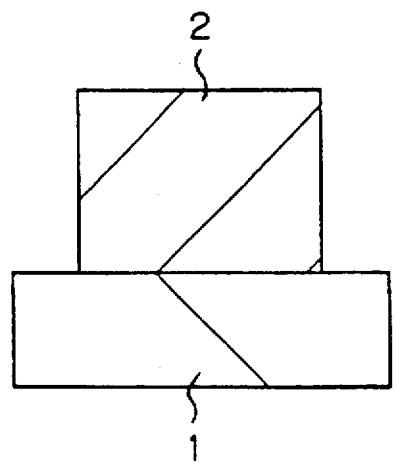
FIGS. 1A and 1B are cross-sectional views for explaining a first example of existing ohmic electrodes.
Figure 1B:
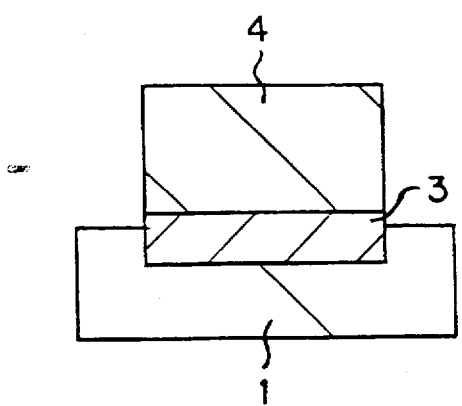
Figure 2A:
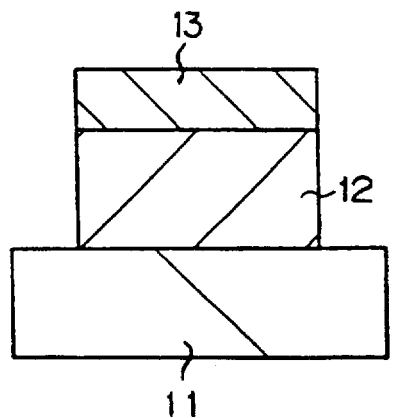
FIGS. 2A and 2B are cross-sectional views for explaining a second example of existing ohmic electrodes.
Figure 2B:
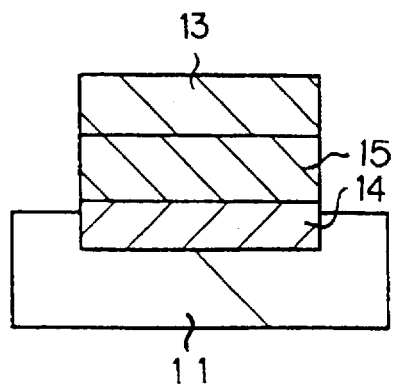
Figure 3A:
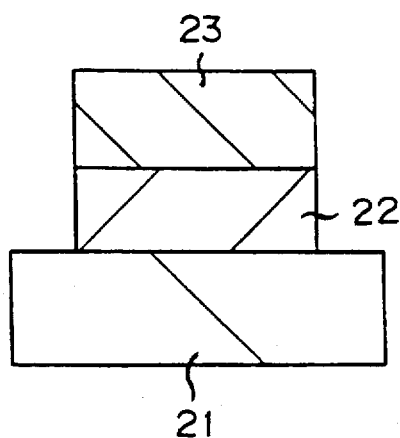
FIGS. 3A and 3B are cross-sectional views for explaining a third example of existing ohmic electrodes.
Figure 3B:
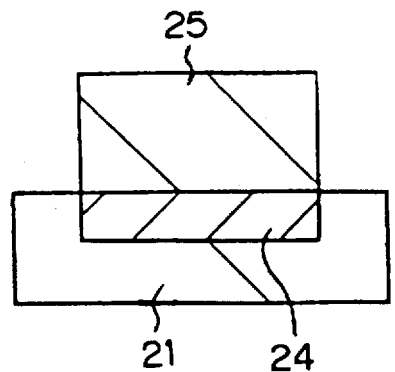
Figure 4:
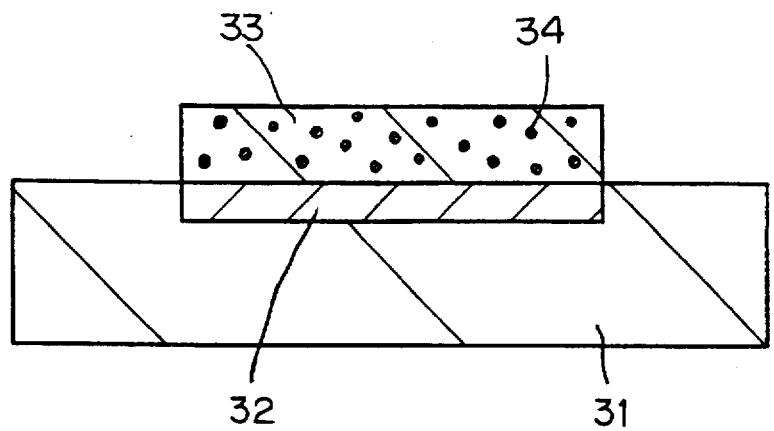
FIG. 4 is a cross-sectional view showing an ohmic electrode according to a first embodiment of the invention.

In a first embodiment of the invention, as shown in FIG. 4, provided on an n$^+$-type GaAs substrate 31 is an ohmic electrode made by sequentially stacking an n$^{++}$-type GaAs layer 32 regrown from the n$^+$-type GaAs substrate 31 and a NiGe film 33. The NiGe film 33 contains a number of fine particles of a precipitate 34 composed of α'-AuGa distributed therein.

Figure 5:
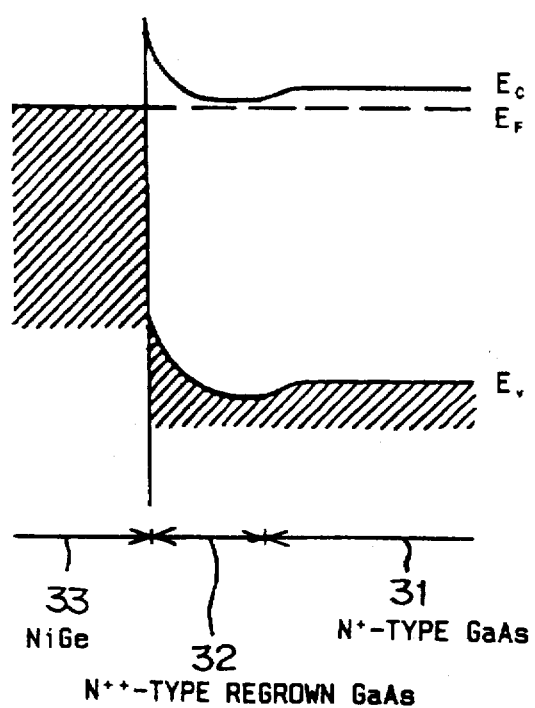
FIG. 5 is an energy band diagram of the ohmic electrode according to the first embodiment of the invention shown in FIG. 4.

FIG. 5 is an energy band diagram of the ohmic electrode according to the embodiment. In FIG. 5, $E_c$ and $E_v$ denote the bottom energy of the conduction band and the top energy of the valence band, respectively, and $E_F$ denotes the Fermi energy.

Next explained is a method for fabricating the ohmic electrode according to a second embodiment of the invention.

Figure 6A:
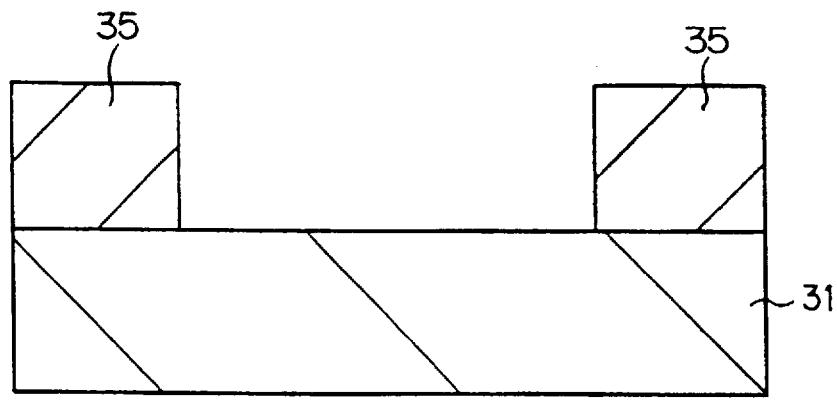
FIGS. 6A to 6C are cross-sectional views for explaining a method for fabricating an ohmic electrode according to a second embodiment of the invention.

As shown in FIG. 6A, a photoresist is applied onto the n$^+$-type GaAs substrate 31. The photoresist is then patterned by a photolithographic method into a resist pattern 35 having an opening in the area corresponding to the ohmic electrode to be made. Exposure in the photolithography is conducted by using an optical exposure apparatus such as a reduced projection exposure apparatus (so-called stepper). An electron beam resist and an electron beam lithography method may be used to make the resist pattern 35.

Figure 6B:
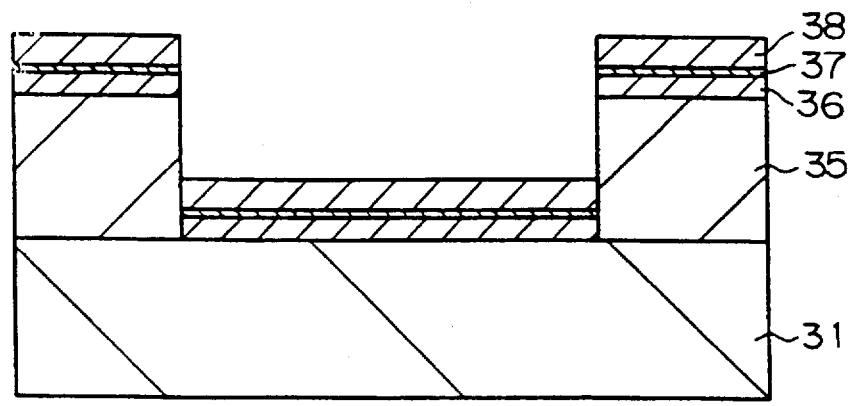

After that, as shown in FIG. 6B, a Ni film 36, an Au film 37 and a Ge film 38 are sequentially provided by, for example, sputtering or vacuum evaporation. The thickness of the resist pattern 35 is determined to be sufficiently larger than the total thickness of the Ni film 36, Au film 37 and Ge film 38.

Figure 6C:
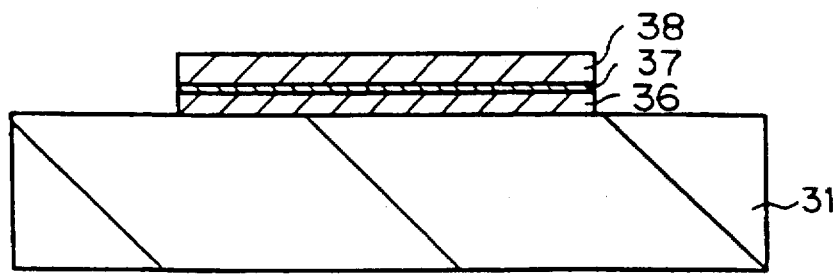

The n$^+$-type GaAs substrate 31 having provided thereon the Ni film 36, Au film 37 and Ge film 38 is immersed in an organic solvent such as acetone to dissolve the resist pattern 35 off and thereby remove the Ni film 36, Au film 37 and Ge film 38 which were made on the resist pattern 35. As a result, as shown in FIG. 6C, the Ni film 36, Au film 37 and Ge film 38 remain only in the selective area on the n-type GaAs substrate 31 corresponding to the opening of the resist pattern 35.

The n$^+$-type GaAs substrate 31 having provided thereon the Ni film 36, Au film 37 and Ge film 38 is then annealed by an RTA(Rapid Thermal Annealing) method or conventional furnace annealing method in an atmosphere composed of, for example a, N$_2$ gas with or without a small amount of a H$_2$ gas at a temperature of 400–750° C., and more preferably, 450–550° C., for a duration of time ranging from several seconds to several minutes, for example. As a result of the annealing, as shown in FIG. 4, the n$^{++}$-type regrown GaAs layer 32 is formed by regrowth of a GaAs layer from the n$^+$-type GaAs substrate 31 and by diffusion of, for example, Ge into the GaAs layer, and the NiGe film 33 containing fine particles of the precipitate 34 composed of α'-AuGa is formed on the n -type regrown GaAs layer 32.

In the above-described process, the ohmic electrode composed of the n$^{++}$-type regrown GaAs layer 32 and the NiGe film 33 containing fine particles of the precipitate 34 composed of α'-AuGa is fabricated.

Some samples of the ohmic electrode according to the second embodiment were made in which the Au films 37 are 5nm thick, the Ge films 38 are 10nm thick, thicknesses of the Ni film 36 vary by 4nm in the range of 36nm to 60nm, and the structures after formation of the Ni film 36, Au film 37 and Ge film 38 were annealed at various temperatures for five seconds by the RTA method. By measurement of contact resistances of the samples, it was found that one of the samples with a 40nm thick Ni film 36 and annealed at 450° C. had a lowest contact resistance, namely, about 0.2Ωmm. Note that the samples were made by using n$^+$-type GaAs substrates 31 prepared by implanting Si ions into (100)-oriented semi-insulating GaAs substrates to exhibit an n-type conductivity with the impurity concentration of 2×10$^{18}$cm$^{-3}$. The n$^{++}$-type regrown GaAs layers 32 were doped with Ge to a degree of impurity concentration of 1×10$^{19}$cm$^{-3}$. The Ni films 36 and the Ge films 38 were made by a vacuum evaporation method using an electron beam, and the Au films 37 were made by a vacuum evaporation method combined with resistance heating.

Figure 7:
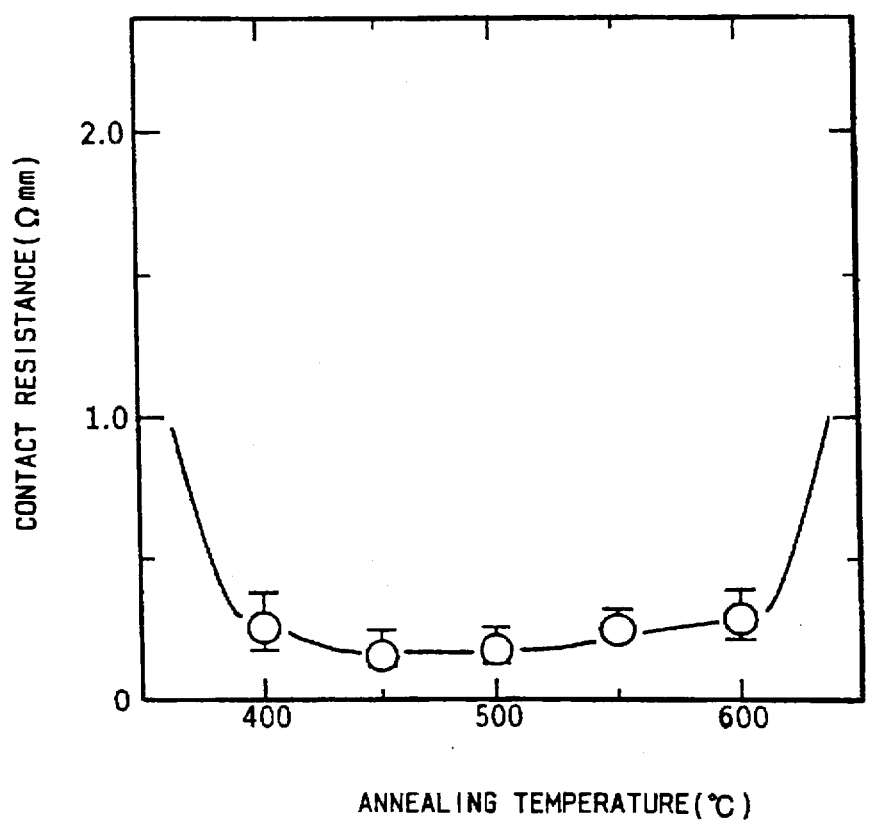
FIG. 7 is a graph showing a result of a measurement of changes in contact resistance of the ohmic electrode according to the first embodiment with annealing temperatures.

FIG. 7 shows measured contact resistances of ohmic electrodes as functions of the annealing temperatures as to some of the samples each having a 40nm thick Ni film 36, 5nm thick Au film 37 and 100nm thick Ge film 38, and annealed at various temperatures in the range of 400–600° C. for five seconds by the RTA method in an atmosphere composed of a N$_2$ gas added with 5% of a H$_2$ gas. FIG. 7 shows that a lowest contact resistance, about 0.2Ωmm, is obtained when the annealing temperature is 450° C. The measurement of contact resistances was conducted by TLM (transmission line method). The sheet resistance of the ohmic electrode was also measured and was revealed to be a significantly low value of about 2Ω/□.

Figure 8:
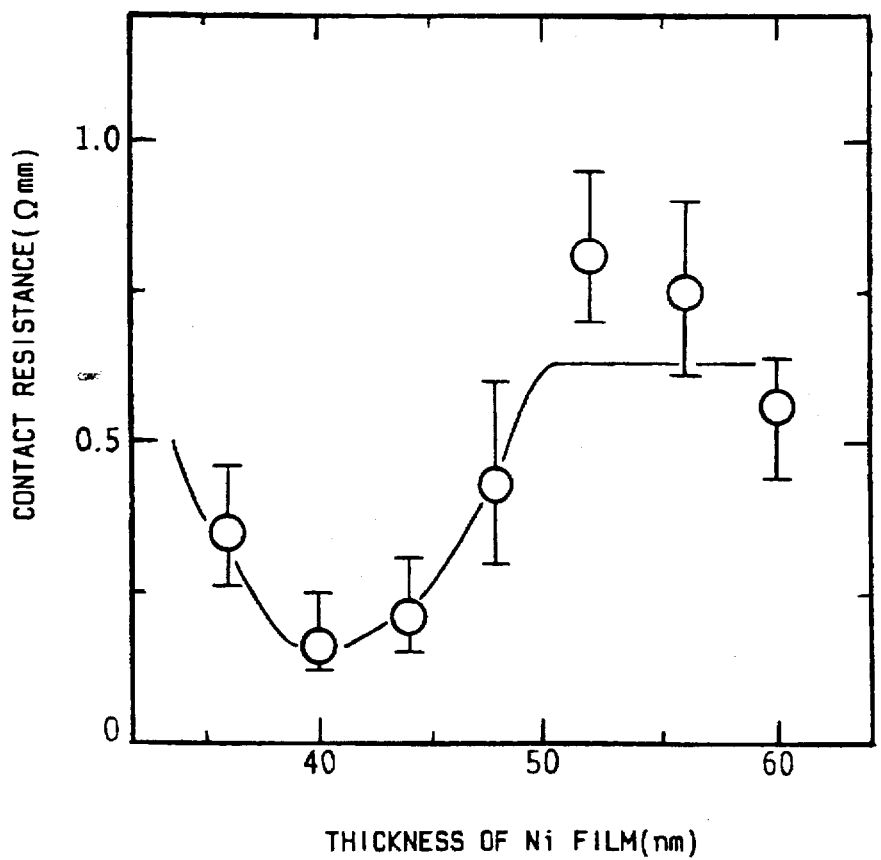
FIG. 8 is a graph showing a result of a measurement of changes in contact resistance of the ohmic electrode according to the first embodiment with thickness of the Ni film composing the ohmic electrode.

FIG. 8 shows changes in contact resistance of ohmic electrodes according to the second embodiment in which Au films 37 and Ge films 38 composing the ohmic electrodes are uniformly 5nm thick and 100nm thick, respectively, and Ni films 36 are different in thickness. The annealing for making the ohmic electrodes was conducted by the RTA method at 450° C. for five seconds in an the atmosphere composed of N$_2$ gas added with 5% of H$_2$ gas. FIG. 8 shows that ohmic electrodes exhibit a lowest contact resistance (about 0.2Ωmm) when the thickness of the Ni film 36 is around 40nm.

One of the ohmic electrodes exhibiting the lowest contact resistance was observed by an optical microscope. Then, the surface was quite smooth, and the edge was sharp. A cross section of the interfacial portion between the ohmic electrode and the n$^+$-type GaAs substrate 31 was also observed by a transmission electron microscope. Then, the interface was uniform, and the depth of diffusion of the metal into the n type GaAs substrate 31 was as shallow as ~20nm.

When the Ni film 36, Au film 37 and Ge film 38 are made uniformly 40nm thick, 5nm thick and 100nm thick, respectively, their composition ratios relative to the entirety of the Ni film 36, Au film 37 and Ge film 38 are 43.8 atomic percent, 3.5 atomic percent and 52.7 atomic percent, respectively, and corresponding $X_{Ni}/X_{Ge}$ is about 0.83.

Figure 9:
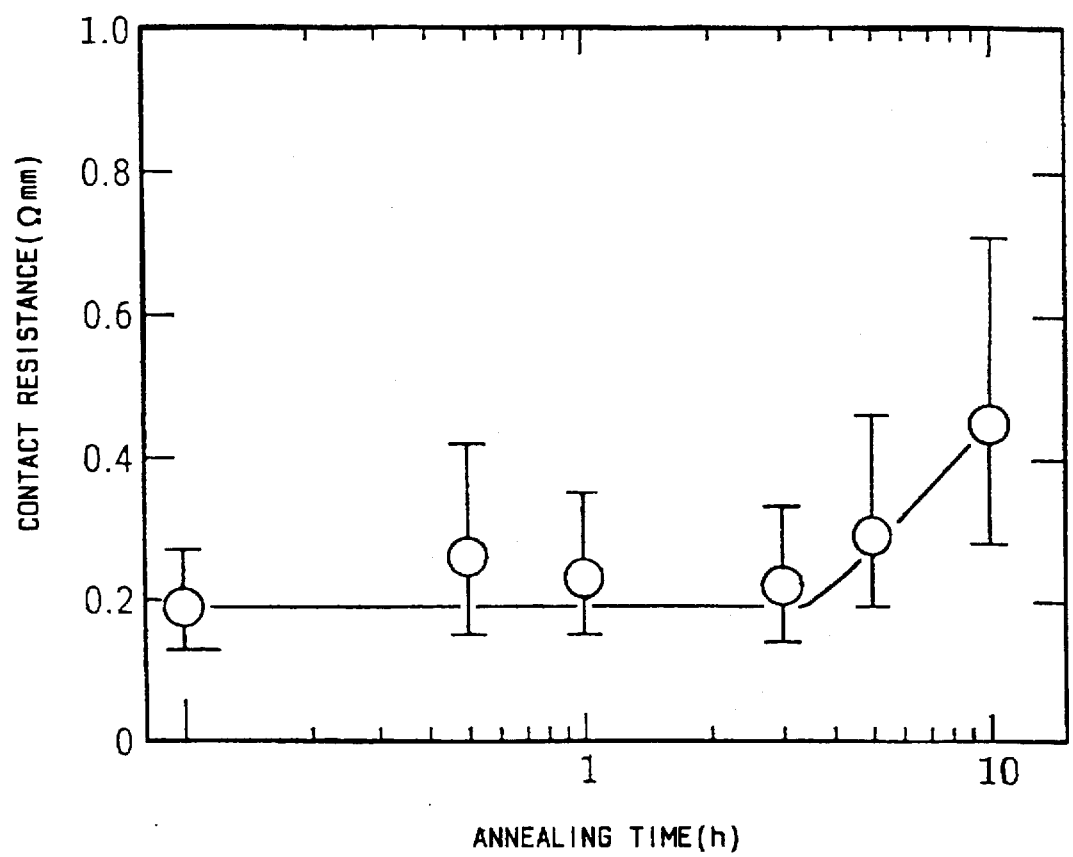
FIG. 9 is a graph showing a result of a measurement of thermal stability of the ohmic electrode according to the first embodiment.

FIG. 9 shows a result of measurement of changes in contact resistance of the ohmic electrode with time, that is, thermal stability of the ohmic electrode, when a sample exhibiting the lowest contact resistance was annealed at 400° C. No substantial change in contact resistance is observed in FIG. 9 even with the annealing at 400° C. for about three hours after formation of the ohmic electrode, which means that a good thermal stability has been obtained.

Figure 10:
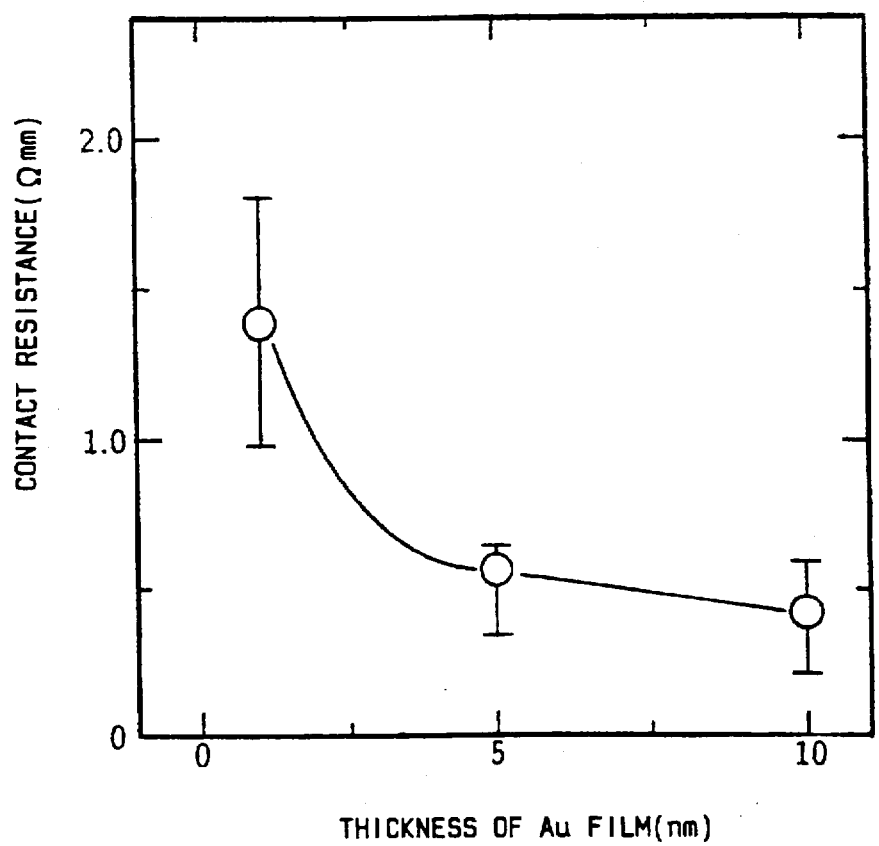
FIG. 10 is a graph showing a result of a measurement of changes in contact resistance of the ohmic electrode according to the first embodiment with thickness of the Au film composing the ohmic electrode.

FIG. 10 shows changes in contact resistance of ohmic electrodes according to the second embodiment in which Ni films 36 and Ge films 38 used for fabricating the ohmic electrodes are made uniformly 60nm thick and 100nm thick, respectively, and the Au films 37 vary in thickness. The annealing for making the ohmic electrodes was conducted by the RTA method at 450° C. for five seconds in the atmosphere composed of N$_2$ gas added with 5% of H$_2$ gas. It is clear from FIG. 10 that, with thicknesses of the Au films 37 in the range of 2–10nm, the contact resistance decreases with an increase in thickness of the Au film 37, that is, with an increase in composition ratio of the Au film 37 relative to the entirety of the Ni film 36, Au film 37 and Ge film 38.

As described above, the second embodiment can easily make on the n$^+$-type GaAs substrate 31 the ohmic electrode composed of the n$^{++}$-type GaAs layer 32 and the NiGe film 33 containing fine particles of the precipitate 34 composed of α'-AuGa having $T_m \approx 415°$ C. as shown in FIG. 4, by making a predetermined pattern of the Ni film 36, Au film 37 and Ge film 38 on the n$^+$-type GaAs substrate 31 and then annealing the structure at a temperature of 400–750° C., more preferably of about 450–550° C. The ohmic electrode obtained is excellent in thermal stability, surface flatness, and edge sharpness and exhibits a low contact resistance, low film resistance and short diffusion length. In addition, the ohmic electrode can be made by an easy process. Thus, the ohmic electrode is quite excellent for use with GaAs.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the method for fabricating an ohmic electrode in the second embodiment makes the Ni film 36, Au film 37 and Ge film 38 in the form corresponding to the ohmic electrode by the so-called lift-off method, the same form of the Ni film 36, Au film 37 and Ge film 38 may be made by first providing the Ni film 36, Au film 37 and Ge film 38 in sequence on the entire surface of the $n^+$-type GaAs substrate 31 and then patterning these films 36, 37 and 38 into the form of the ohmic electrode by etching.

In addition, although the embodiments have been described as applying the invention to ohmic electrodes for $n^+$-type GaAs substrates 31, the invention may be applied to ohmic electrodes for $n^+$-type GaAs layers made by, for example, epitaxial growth.

As described above, according to the ohmic electrode of the invention, ohmic electrodes for III-V compound semiconductors having practically satisfactory characteristics can be realized.

According to the method for fabricating an ohmic electrode of the invention, ohmic electrodes for III-V compound semiconductors having practically satisfactory characteristics can be easily fabricated.

Further, according to the semiconductor device of the invention, high-performance semiconductor devices can be realized, in which ohmic electrodes of semiconductor elemental devices provided on a III-V compound semiconductor body have characteristics required in devices in practice.

Although various minor changes and modifications might be proposed by those skilled in the art, it will be understood that we wish to include within the claims of the patent warranted hereon all such changes and modifications as reasonably come within our contribution to the art.

What is claimed is:

1. An ohmic electrode, comprising;
   a regrown III-V compound semiconductor layer regrown from a III-V compound semiconductor body;
   said regrown III-V compound semiconductor layer having a higher impurity concentration than said III-V compound semiconductor body, and
   a NiGe film arranged on said regrown III-V compound semiconductor layer and including particles of a precipitate which are a compound of at least one element selected from a group consisting of Au, Pt, Pd and Ag and a group III element constituting said III-V compound semiconductor body, said precipitate having a melting point of 400° C. or higher.

2. The ohmic electrode according to claim 1 wherein said III-V compound semiconductor body and said regrown III-V compound semiconductor layer are of n-types.

3. The ohmic electrode according to claim 1 wherein said III-V compound semiconductor body and said regrown III-V compound semiconductor layer match in crystal lattice with each other.

4. The ohmic electrode according to claim 2 wherein said III-V compound semiconductor body and said regrown III-V compound semiconductor layer match in crystal lattice with each other.

5. The ohmic electrode according to claim 1 wherein said III-V compound semiconductor body is composed of GaAs, AlGaAs or InGaAs.

6. The ohmic electrode according to claim 2, wherein said III-V compound semiconductor body is composed of GaAs, AlGaAs or InGaAs.

7. The ohmic electrode according to claim 1 wherein said regrown III-V compound semiconductor layer is composed of GaAs, AlGaAs or InGaAs.

8. The ohmic electrode according to claim 3 wherein said regrown III-V compound semiconductor layer is composed of GaAs, AlGaAs or InGaAs.

9. The ohmic electrode according to claim 3 wherein said regrown III-V compound semiconductor layer is composed of GaAs, AlGaAs or InGaAs.

10. The ohmic electrode according to claim 1 wherein said at least one element is Au, and said compound is $\alpha'$-AuGa.

11. The ohmic electrode according to claim 3 wherein said at least one element is Au, and said compound is $\alpha'$-AuGa.

12. The ohmic electrode according to claim 3 wherein said at least one element is Au, and said compound is $\alpha'$-AuGa.

13. The ohmic electrode according to claim 1 wherein said regrown III-V compound semiconductor layer has a lower resistivity than said III-V compound semiconductor body.

14. The ohmic electrode according to claim 1 wherein said III-V compound semiconductor body is an n-type GaAs substrate, said regrown III-V compound semiconductor layer is an n-type GaAs layer, said at least one element is Au, and said compound is $\alpha'$-AuGa.

15. A semiconductor device including a semiconductor element device on a III-V compound semiconductor body, said semiconductor element device having an electrode, comprising:
   a region III-V compound semiconductor layer regrown from said III-V compound semiconductor body;
   said regrown III-V compound semiconductor layer having a higher impurity concentration than said III-V compound semiconductor body: and
   a NiGe film arranged on said regrown III-V compound semiconductor layer and including particles of a precipitate which are a compound of at least one element selected from a group consisting of Au, Pt, Pd and Ag and a group III element constituting said III-V compound semiconductor body, said precipitate having a melting point of 400° C. or higher.

16. The semiconductor device according to claim 15 wherein said at least one element is Au, and said compound is $\alpha'$-AuGa.

17. An ohmic electrode, comprising;
   a regrown III-V compound semiconductor layer regrown from a III-V compound semiconductor body;
   a NiGe film arranged on said regrown III-V compound semiconductor layer and including particles of a precipitate which are a compound of at least one element selected from a group consisting of Au, Pt, Pd and Ag and a group III element constituting said III-V compound semiconductor body, said precipitate having a melting point of 400° C. or higher; and said at least one element is Au, and said compound is α'-AuGa.

18. An ohmic electrode, comprising;

a regrown III-V compound semiconductor layer regrown from a III-V compound semiconductor body;

a NiGe film arranged on said regrown III-V compound semiconductor layer and including particles of a precipitate which are a compound of at least one element selected from a group consisting of Au, Pt, Pd and Ag and a group III element constituting said III-V compound semiconductor body, said precipitate having a melting point of 400° C. or higher; and said III-V compound semiconductor body is an n-type GaAs substrate, said regrown III-V compound semiconductor layer is an n-type GaAs layer, said at least one element is Au, and said compound is α'-AuGa.

19. A semiconductor device including a semiconductor element device on a III-V compound semiconductor body, said semiconductor element device having an electrode, comprising:

a region III-V compound semiconductor layer regrown from said III-V compound semiconductor body;

a NiGe film arranged on said regrown III-V compound semiconductor layer and including particles of a precipitate which are a compound of at least one element selected from a group consisting of Au, Pt, Pd and Ag and a group III element constituting said III-V compound semiconductor body, said precipitate having a melting point of 400° C. or higher; and said at least one element is Au, and said compound is α'-AuGa.

* * * * *